(12) United States Patent
Mathew et al.

(10) Patent No.: US 6,573,756 B2
(45) Date of Patent: Jun. 3, 2003

(54) ACTIVE NOISE-CANCELING SCHEME FOR DYNAMIC CIRCUITS

(75) Inventors: Sanu K. Mathew, Hillsboro, OR (US); Mark Anders, Hillsboro, OR (US); Ram Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/919,785

(22) Filed: Jul. 31, 2001

(65) Prior Publication Data

US 2003/0025523 A1 Feb. 6, 2003

(51) Int. Cl.[7] .................. H03K 17/16; H03K 19/096
(52) U.S. Cl. ................................ 326/96; 326/24
(58) Field of Search .................. 326/95, 96, 97, 326/98, 23, 24, 25, 83, 86

(56) References Cited

U.S. PATENT DOCUMENTS

| | | | |
|---|---|---|---|
| 5,841,300 A | * 11/1998 | Murabayashi et al. | 326/98 |
| 6,002,272 A | * 12/1999 | Sonasekhar et al. | 326/98 |
| 6,404,234 B1 | * 6/2002 | Hsu et al. | 326/93 |
| 2002/0075038 A1 | * 6/2002 | Mathew et al. | 326/95 |

* cited by examiner

*Primary Examiner*—Daniel Chang
(74) *Attorney, Agent, or Firm*—Fish & Richardson P.C.

(57) ABSTRACT

A noise canceling circuit is provided in a dynamic circuit that includes a high fan-in domino gate. The noise canceling circuit decouples noise from neighboring wires in the dynamic circuit that is injected into a wire that controls the domino gate.

19 Claims, 2 Drawing Sheets

ACTIVE NOISE-CANCELING SCHEME FOR DYNAMIC CIRCUITS

BACKGROUND

High fan-in domino gates tend to be leaky and prone to noise. Examples of such gates are high fan-in dynamic NOR gates used in schedulers and register files. The inputs to these dynamic gates may traverse long distances running parallel to each other. A capacitive charge may develop between neighboring read-select lines, which may increase with the length of the wires, their height, and inversely to the distance between them.

The inter-wire coupling capacitance between the read-select lines may be a significant source of noise, and may affect the performance of the high fan-in domino gates. One technique for dealing with capacitive coupled noise in the circuit is to replace the leaky high fan-in domino gates with gates that include transistors with high threshold voltages ($V_t$). However, the use of high $V_t$ devices may entail certain performance trade-offs.

DETAILED DESCRIPTION

Figure 1:
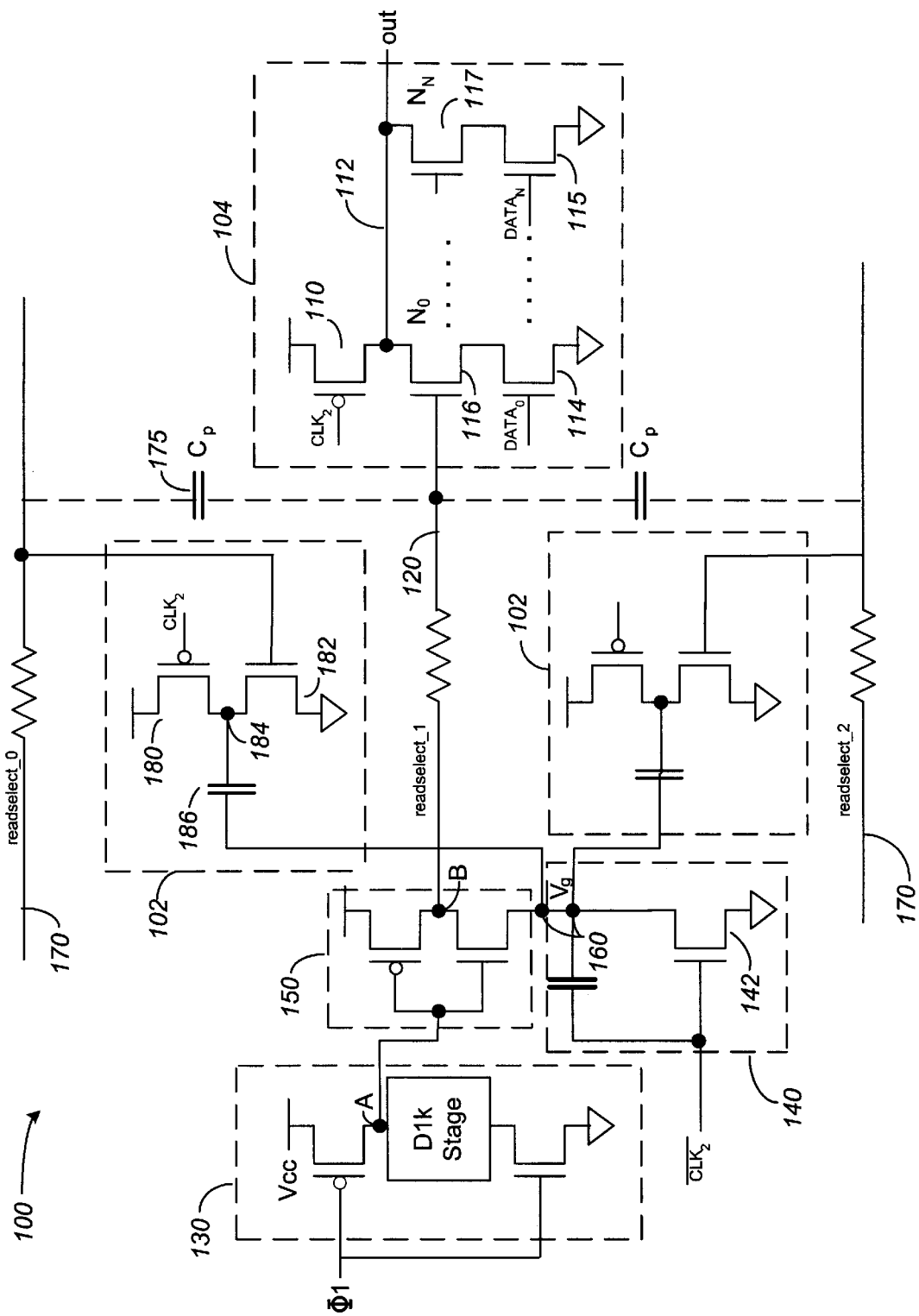
FIG. 1 is a schematic diagram of a dynamic circuit including a noise canceling circuit according to an embodiment.

FIG. 1 illustrates a register file circuit 100 including a noise-canceling circuit 102 according to an embodiment. The noise canceling circuit 102 may decouple noise at the input of a high fan-in domino gate 104 that is induced by charge coupling affects caused by transitions on adjacent read-select lines.

The domino gate 104 illustrated is a high fan-in dynamic NOR gate. The NOR gate includes a PMOS transistor 110 with a source coupled to Vcc, a local bitline 112, and a parallel stack of NMOS transistors. Each stack includes an NMOS transistor 116 with a drain coupled with the local bit line 112 and a source coupled to the drain of another NMOS transistor 114. The source of NMOS transistor 114 is coupled to ground. The gate of transistor 116 is controlled by the readselect_1 signal 120. The gate of transistor 114 is controlled by a $data_0$ signal.

Transistors 117 and 115 form another similar stack with the gate of 117 controlled by another readselect signal, e.g., readselect_N, and the gate of 115 controlled by another data signal, e.g., $data_N$.

The readselect signals reaadselect_0 . . . readselect_N may be mutually exclusive. Thus, only one of them can transition high at any point, causing the local bitline to discharge depending on the value of the data signal that it is stacked with. Thus, a NOR operation is performed.

Figure 2:
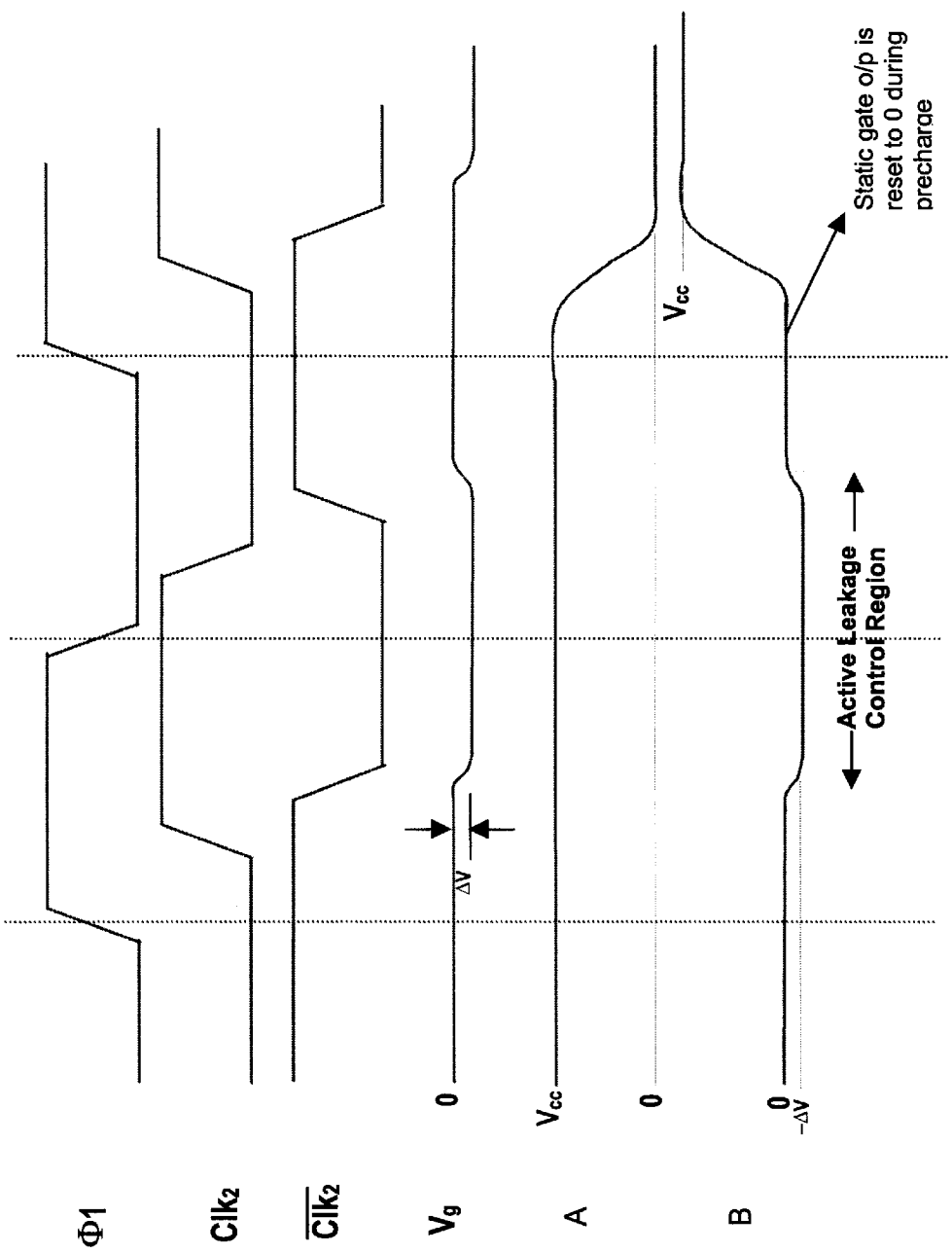
FIG. 2 is a timing diagram for signals in the circuit illustrated in FIG. 1.

The gate of the PMOS transistor 110 is controlled by a clock signal $Clk_2$. The $Clk_2$ signal causes the dynamic NOR gate 104 to transition between a pre-charge mode and an evaluate mode each system clock cycle. The read-select line 120 is controlled by a dynamic driver 130, which in turn is controlled to transition between the pre-charge and evaluate modes by a Φ1 clock signal. Exemplary timing signals for the Φ1 and $Clk_2$ clock signals are shown in FIG. 2.

The dynamic NOR gate 104 enters the pre-charge mode when $Clk_2$ transitions LOW and the PMOS transistor 110 turns on, opening the path to Vcc. The signals are timed such that when the PMOS transistor turns on, the signal on the read-select line 120 is LOW, and the input NMOS transistors 116 and 117 are off. This closes the path from the local bitline 112 through the NMOS transistors 114, 115 and ground. Accordingly, during pre-charge, the bitline 112 is pulled HIGH.

The dynamic NOR gate 104 enters the evaluate mode when $Clk_2$ transitions HIGH, turning off the PMOS transistor 110 and closing the path to Vcc. During evaluation, if the read-select line 120 transitions HIGH, the input transistor 116 will turn on, opening a path between the HIGH signal on the bitline 112 and the NMOS transistors 114. If data signal $data_0$ at the gate of the NMOS transistor 114 is HIGH, transistor 114 will turn on. This will open a discharge path to ground, and the bitline 112 will be pulled LOW. If the data signal $data_0$ is LOW, the NMOS transistor 114 will be OFF, and the signal on the bitline 112 will remain HIGH. These conditions give the dynamic circuit 104 its NOR gate functionality.

The input transistors of high fan-in domino gates tend to be leaky. Even when the signal on the read-select line 120 at the gates of the input transistors 116, 117 is LOW, the input transistors 116, 117 may not be completely turned off. This may create a discharge path from Vcc to ground during evaluation mode, which may impair the performance of the device and potentially compromise the logic level of the bitline 112.

In order to avoid such leakage, the input transistors 116 may be replaced with transistors with higher threshold voltages ($V_t$) to reduce the leakage and the improve gate's robustness to noise. However, the use of higher $V_t$ devices may entail certain performance trade-offs.

Alternatively, a low $V_t$ enabler circuit 140 may be coupled to a static inverter 150 at the output of the dynamic driver 130. The low $V_t$ enabler circuit 140 includes an NMOS transistor 142 coupled between an NMOS transistor 152 in the static inverter 150, and a capacitor 144 coupled between the drain of the NMOS transistor 142 and its gate. The node 160 at the drain of the NMOS transistor may be considered a virtual ground node 160 ($V_g$). The NMOS transistor is controlled by a clock signal $\overline{Clk_2}$, which is the approximate complement of the $Clk_2$ signal, as shown in FIG. 2. During evaluation, $\overline{Clk_2}$ transitions LOW, and the NMOS transistor 142 turns off, closing the path to ground. The capacitor 144 pulls the virtual ground node 160 a voltage $-\Delta V$, which is slightly below ground, in response to the falling transition at the gate. This $\Delta V$ may be between about 10 mV and 100 mV, depending on the size and type of the transistors, and the size of the capacitor 144.

When the NMOS transistor 152 in the inverter is ON, which is the case when the read-select line 120 is not selected, the path to the virtual ground node 160 is opened, and the read-select line 120 is pulled to the voltage on the virtual ground node 160. During evaluation, when $V_g$ is at $-\Delta V$, the negative voltage under-drives the gate terminals of the low $V_t$ input NMOS transistors 116 in the high fan-in domino gate. Under-driving the gates of the transistors 116 causes them to turn strongly OFF, thereby reducing the amount of leakage in the circuit. During pre-charge, $Clk_2$ goes HIGH, which restores the virtual ground node 160 and the gates of input transistors 116 to 0 V. Hence, the evaluation delay in one cycle is unaffected by the under-driving operation in the previous cycle.

The negative voltage $-\Delta V$ on the virtual ground node 160 may be susceptible to noise, which may negate the benefits provided by the low $V_t$ enabler circuit 140. Noise may be induced by signal transitions on adjacent readselect lines 170. A capacitive charge may develop between neighboring wires in an integrated circuit, which may increase with the length of the wires, their height, and inversely to the distance between them. This inherent capacitance is represented in FIG. 1 by a parasitic capacitor 175. Noise may be injected on a victim wire, e.g., the read-select line 120, by the parasitic capacitor 175 in response to a neighboring wire 170 transitioning between Vcc and ground.

In an embodiment, noise-canceling circuits 102 may be connected between neighboring read-select lines 170 and the virtual ground node 160 of the static inverter 150 to decouple noise injected onto read-select line 120 in response to those neighboring lines 170 transitioning between Vcc and ground.

The noise canceling circuit 102 includes a PMOS transistor 180 with a gate controlled by the $Clk_2$ signal, and an NMOS transistor 182 with a gate coupled to the neighboring read-select line 170. An output node 184 between the PMOS transistor 180 and the NMOS transistor 182 is coupled to one side (the "near side") of a capacitor 186. The other side (the "far side") of the capacitor 186 is coupled to the virtual ground node 160. The capacitor 186 may have a capacitance that is approximately equal (to a first-order) to that of parasitic capacitor 175.

During the NOR gate's 104 pre-charge, both $Clk_2$ and the neighboring read-select line 170 are LOW. With PMOS transistor 180 ON and NMOS transistor 182 OFF, the output node 184 is pulled HIGH, charging the near side of the capacitor 186 to Vcc.

During evaluation, $Clk_2$ is HIGH and the PMOS transistor 180 is OFF, closing the path to Vcc. During that time, if read-select line 120 is not selected, e.g., the signal on read-select line 120 is LOW, the gates of the input transistors 116, 117 are under-driven by $-\Delta V$ supplied by the virtual ground node 160. If neighboring read-select line 170 transitions HIGH, the rising edge of the transition on read-select line 170 will cause the parasitic capacitor 175 to inject noise onto the victim read-select line 120, and hence to the gates of the input transistors 116. This noise will also be injected onto the virtual ground node 160 through the (ON) NMOS transistor 152 of the static inverter 150.

The rising signal on the neighboring read-select line 170 will also start to turn on NMOS transistor 182 in the noise canceling circuit 102. As the discharge path to ground opens, the HIGH signal on the output node 184 begins to transition LOW. This falling transition from Vcc to ground on the near side of the capacitor 186 causes the capacitor 186 to inject a signal onto the virtual ground node that is approximately equal in magnitude but opposite in polarity to the noise injected by the parasitic capacitor 175. Thus, the two signals tend to cancel out, and the noise injected by the transition of the neighboring read-select line 170 is effectively decoupled from the virtual ground node. This active decoupling may improve the performance of the circuit.

If the read-select line 170 does not transition HIGH during evaluation, the near side of capacitor 186 remains floating at Vcc, and the parasitic capacitor 175 will not interfere with the virtual ground node 160 of the read-select line 120.

The devices in the noise-canceling circuit 102 may be relatively small to the read-select lines and hence will not significantly impact the performance of the circuit. Although there may be a dynamic power overhead associated with the low $V_t$ enabler circuit, it has been found that overall performance may be improved compared to circuits that incorporate high $V_t$ devices and compared to low $V_t$ devices that do not utilize the low $V_t$ enabler circuit.

The noise-canceling scheme described above may be utilized for dynamic circuits in noisy environment other than the register file circuit 100, for example, schedulers and dynamic buses. The noise-canceling scheme may also be used to reduce leakage in high fan-in domino gates other than the dynamic NOR gate 104 illustrated.

A number of embodiments have been described. Nevertheless, it will be understood that various modifications may be made without departing from the spirit and scope of the invention. Accordingly, other embodiments are within the scope of the following claims.

What is claimed is:

1. A method comprising:
  injecting a noise-canceling signal into a first wire coupled to an input of a high tan-in dynamic circuit in response to a noise signal injected into the first wire, said noise-canceling signal having a magnitude substantially equal to the magnitude of the noise signal and opposite in polarity to the noise signal.

2. A method comprising:
  injecting first signal into a first wire coupled to an input of a high fan-in dynamic circuit in response to a noise signal injected into the first wire,
  wherein the noise signal comprises a capacitive coupled noise signal generated between the first wire and a neighboring wire, and
  wherein said injecting the first signal comprises generating a noise-canceling signal with a capacitor having a capacitance approximately equal to a parasitic capacitance between the first wire and the neighboring wire.

3. The method of claim 2, wherein the capacitance of the capacitor is equal to a first-order to the parasitic capacitance.

4. The method of claim 2, wherein said injecting the first signal comprises generating a noise-canceling signal in response to a transition in the neighboring wire.

5. Apparatus comprising:
  a high fan-in dynamic circuit including a plurality of input transistors, each input transistor coupled to a corresponding input wire;
  a virtual ground node coupled to the input wire; and
  a noise-canceling circuit coupled to the virtual ground node and operative to inject a first signal into the virtual ground node in response to a noise signal injected into the input wire,
  wherein the first signal comprises a signal having a magnitude substantially equal to the magnitude of the noise signal and a polarity opposite to a polarity of the noise signal.

6. The apparatus of claim 5, further comprising a low $V_t$ enabler circuit operative to drive the virtual ground node below 0 V.

7. The apparatus of claim 6, wherein the low $V_t$ enabler circuit is operative to drive the virtual ground node below 0 V while the high fan-in dynamic circuit is in an evaluate mode.

8. Apparatus comprising:
  a high fan-in dynamic circuit including a plurality of input transistors, each input transistor coupled to a corresponding input wire;
  a virtual ground node coupled to the input wire; and
  a noise-canceling circuit coupled to the virtual ground node and operative to inject a first signal into the virtual ground node in response to a noise signal injected into the input wire, wherein the noise-canceling circuit comprises a capacitor coupled between the input wire and a neighboring wire, and wherein the noise-canceling circuit comprises a capacitor having a capacitance approximately equal to a parasitic capacitance between the input wire and the neighboring wire.

9. The apparatus of claim 8, wherein the capacitance of the capacitor is equal to a first-order to said parasitic capacitance.

10. The apparatus of claim 8, wherein the noise-canceling circuit comprises an inverter including a PMOS transistor coupled to an NMOS transistor at a node, said node being coupled to a first side of the capacitor.

11. The apparatus of claim 10, wherein the NMOS transistor includes a gate coupled to the neighboring wire.

12. The apparatus of claim 11, further comprising a clock line operative to carry a first clock signal to transition the high fan-in dynamic circuit between a pre-charge mode and an evaluate mode, said clock line being coupled to the high fan-in dynamic circuit and a gate of the PMOS transistor in the noise-canceling circuit.

13. The apparatus of claim 12, further comprising a low $V_t$ enabler circuit includes an NMOS transistor coupled between the virtual ground node and ground, said NMOS transistor having a gate coupled to a second clock line operative to carry a complementary clock signal substantially opposite to said first clock signal, and a capacitor coupled between the virtual ground node and the gate of said NMOS transistor.

14. A device comprising:

a high fan-in dynamic circuit including a plurality of input transistors;

a plurality of wires running in parallel to each other, said plurality of wires including a first wire coupled to one of said plurality of input transistors;

a virtual ground node coupled to the first wire; and a noise-canceling circuit coupled to the virtual ground node and operative to inject a first signal into the virtual ground node in response to a noise signal injected into the first wire, wherein the first signal comprises a magnitude substantially equal to the magnitude of the noise Signal and a polarity opposite to a polarity of the noise signal.

15. The device of claim 14, wherein the high fan-in dynamic circuit comprises a NOR gate.

16. The device of claim 14, further comprising a register file.

17. The device of claim 16, wherein said plurality of wires comprise read-select lines.

18. The device of claim 14, further comprising a dynamic bus.

19. A device comprising:

a high fan-in dynamic circuit including a plurality of input transistors;

plurality of wires running in parallel to each other, said plurality of wires including a first wire coupled to one of said plurality of input transistors;

a virtual ground node coupled to the first wire; and a noise-canceling circuit coupled to the virtual ground node and operative to inject a first signal into the virtual ground node in response to a noise signal injected into the first wire, wherein the noise-canceling circuit comprises a capacitor having a capacitance equal to a first order to a parasitic capacitance between the first wire and the neighboring wire.

* * * * *